(12) United States Patent
Muza (10) Patent No.: US 6,259,322 B1
(45) Date of Patent: Jul. 10, 2001

(54) CURRENT EFFICIENT, ULTRA LOW NOISE DIFFERENTIAL GAIN AMPLIFIER ARCHITECTURE

(75) Inventor: John M. Muza, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/429,557

(22) Filed: Oct. 28, 1999

(51) Int. Cl.$^7$ .................................................. H03F 3/45
(52) U.S. Cl. ..................... 330/257; 330/252; 330/253; 330/260
(58) Field of Search .................................. 330/252, 253, 330/257, 260

(56) References Cited

U.S. PATENT DOCUMENTS

| | | | |
|---|---|---|---|
| 4,999,585 | * 3/1991 | Burt et al. | 330/288 |
| 5,128,630 | * 7/1992 | Mijuskovic | 330/253 |
| 5,157,347 | * 10/1992 | Geerdink et al. | 330/260 |
| 5,825,247 | * 10/1998 | Herrlinger | 330/265 |

* cited by examiner

Primary Examiner—Robert Pascal
Assistant Examiner—Patricia T. Nguyen
(74) Attorney, Agent, or Firm—Dwight N. Holmbo; Wade James Brady, III; Frederick J. Telecky, Jr.

(57) ABSTRACT

A low noise, low current, high bandwidth differential amplifier circuit (30), including a first amplifier (44) driving a first transistor $X_1$ and having a first current source $I_2$ coupled to an input of the first amplifier (44). A first feedback resistor $R_3$ is coupled between the first current source $I_2$ and the first transistor $X_1$, and a second resistor $R_4$ is coupled to the first resistor $R_3$. A second amplifier (46) drives a second transistor $X_2$, and has a second current source $I_3$ coupled to an input of the second amplifier 46. A third feedback resistor $R_5$ is coupled between the second current source $I_3$ and the second transistor $X_2$. A fourth resistor $R_6$ is coupled to the third resistor $R_5$. The first $R_3$ and third $R_5$ feedback resistors are driven by the first $I_2$ and second $I_3$ current sources rather than by the first (44) and second (46) amplifiers, respectively, allowing the first and second amplifiers (44, 46) to be single stage amplifiers. A buffering stage (62) having a high pass filter may be coupled to the output signal. The invention is particularly useful for applications such as mixed signal or analog circuits.

37 Claims, 3 Drawing Sheets

CURRENT EFFICIENT, ULTRA LOW NOISE DIFFERENTIAL GAIN AMPLIFIER ARCHITECTURE

TECHNICAL FIELD OF THE INVENTION

This invention relates generally to the field of electronic amplifier circuits, and more particularly to a low power, low noise differential gain amplifier circuit.

BACKGROUND OF THE INVENTION

The recent miniaturization trend in electronic circuit designs is driven by consumer demand for smaller and light-weight electronic devices such as cellular phones and portable computers, for example. Often, the heaviest component in an electronic device is the battery. Devices having smaller batteries require low power electronic circuits to prevent the battery from discharging too rapidly. Logic integrated circuits (ICs) have migrated to lower working voltages in the search for lower power consumption and higher operating frequencies.

An amplifier is a linear electronic circuit that may be used amplify an input signal and provide an output signal that is a magnified replica of the input signal. Amplifiers are used in a variety of electronic circuit design applications. As appliances and circuit designs continue to decrease in size and increase in speed, the need for low power, low noise, current efficient amplifier circuitry increases.

SUMMARY OF THE INVENTION

The present invention achieves technical advantages as a low noise, low current high bandwidth differential amplifier circuit using matched current mirrors and having single stage op amps. The low power circuit is useful in a variety of applications, particularly in small portable electronic devices such as cellular phones and laptop computers.

In one embodiment, disclosed is a low noise, low current, high bandwidth differential amplifier circuit including a first amplifier driving a first transistor and having a first current source coupled to an input of the first amplifier. A first resistor is coupled between the first current source and the first transistor, and a second resistor is coupled to the first transistor. A second amplifier drives a second transistor, and a second current source is coupled to an input of the second amplifier. A third resistor is coupled between the second current source and the second transistor. A fourth resistor is coupled to the third resistor. The first and third resistors are driven by the first and second current sources, respectively, rather than by the first and second amplifiers, respectively.

In another embodiment, disclosed is a low noise, low current, high bandwidth differential amplifier circuit, having a first amplifier driving the gate of a first transistor. A first current mirror circuit is coupled to the drain of the first transistor, and a first current source is coupled to an input of the first amplifier. A first resistor is coupled between the first current source and the source of the first transistor. A second resistor is coupled to the first transistor source. A second amplifier drives the gate of a second transistor. A second current mirror circuit is coupled to the drain of the second transistor, and a second current source is coupled to an input of the second amplifier. A third resistor is coupled between the second current source and the second transistor source. A fourth resistor is coupled to the third resistor. The second and fourth resistors are coupled to each other at a node. The first and third resistors are driven by the first and second current sources, respectively, rather than by the first and second amplifiers, respectively.

Also disclosed is a differential amplifier circuit having a first branch coupled to a second branch. The first branch includes a first amplifier having a first and second input terminal and driving a first transistor, where the first input terminal is non-inverting and adapted to receive a positive input voltage signal. A first current source is coupled to the first amplifier inverting second input terminal, with a first resistor being coupled between the first current source and the first transistor. The first branch also includes a second resistor coupled to the first resistor, whereby a positive output voltage is generated at the second resistor. The second branch includes a second amplifier having a first and second input terminal and driving a second transistor. The second amplifier first input terminal is non-inverting and is adapted to receive a negative input voltage signal. The second branch has a second current source coupled to the second amplifier inverting second input terminal. A third resistor is coupled between the second current source and the second transistor. A fourth resistor is coupled at one end to the third resistor, with a negative output voltage being at the other end of the fourth resistor. The second and fourth resistors are coupled to each other at a node. The first and third resistors are driven by the first and second current sources, respectively, rather than by the first and second amplifiers, respectively.

In another embodiment, disclosed is a method of amplifying a differential electrical input signal in a differential amplifier circuit having a first and second branch. Each branch includes an amplifier driving a respective transistor, each amplifier having a feedback resistor and an output resistor. The branches are coupled together at the output resistors. The method includes the steps of driving the feedback resistors with a respective first current source, and generating an output signal at the output resistors.

The present invention is advantageous in providing a low noise, low current, high bandwidth differential amplifier circuit. Because the first and second amplifiers do not drive the first and third resistors, they can be simpler, single stage amplifiers. This reduces power consumption and saves semiconductor real estate. The present invention provides a low power way of achieving a closed loop voltage gain with low noise. The need for an output stage has been removed so that simple single-stage op amps may be used for the amplifiers, which translates to wide bandwidth. The amplifiers have a very high input impedance and small resistors may be used. Furthermore, the circuit has great flicker and thermal noise performance. The gain and bandwidth are independent of one another, rather than being a function of one another as in prior art circuits. The Gain-Bandwidth Product (GBP) relationship in prior art circuits does not apply for the present invention. Also, total harmonic distortion (THD) and power supply rejection ratio (PSRR) performance is maximized by the present invention. Gain is determined by the resistor ratio, through size variations of the transistors that comprise the current mirror circuits, or a combination thereof.

BRIEF DESCRIPTION OF THE DRAWINGS

In the drawings, which form an integral part of the specification and are to be read in conjunction therewith.

Like numerals and symbols are employed in different figures to designate similar components in various views unless otherwise indicated.

DETAILED DESCRIPTION OF PREFERRED EMBODIMENTS

Figure 1:
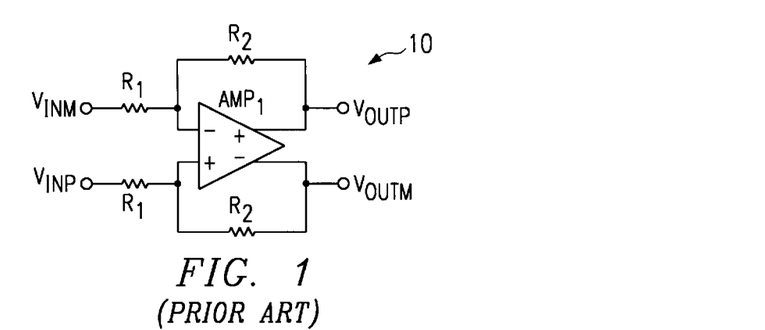
FIG. 1 shows a prior art differential amplifier with a typical closed loop gain configuration, with the gain determined by the resistor ratio $R_2/R_1$.

An operational amplifier (op amp) is a particular type of amplifier having two input terminals and at least one output terminal, that is capable of sensing the difference between the voltages at the input terminals, and multiplying this difference by the gain of the op amp to generate an output signal. FIG. 1 shows a typical closed-loop amplifier circuit configuration 10 having a negative input signal $V_{inm}$, a positive input signal $V_{inp}$, a positive output signal $V_{outp}$ and negative output signal $V_{outm}$. The closed loop gain $A_{vcl}$ is determined by the resistor ratios:

Equation 1:
$$A_{vcl} = \frac{\Delta V_{out}}{\Delta V_{in}} = \frac{R_2}{R_1}$$

A problem with the prior art circuit 10 is that the input resistance $R_1$ contributes to the noise of the output signal. The larger the value of the input resistor $R_1$, the worse or higher the noise. The circuit 10 has an input impedance of:

$$Zin_{diff} = 2R_1.$$ 
Equation 2

In applications where low noise is important, the value of $R_1$ must not be large, because the thermal noise of the resistor $R_1$ is directly reflected as input referred noise.

As an example of a design noise floor with this prior art circuit 10, for a 20 Hz to 2 MHz bandwidth and an average noise density of $4nV/\sqrt{Hz}$, dividing the noise budget equally between amplifier $Amp_1$ and resistors $R_1$ and $R_2$ at room temperature requires a relative small resistor $R_1$ of approximately 250Ω, for example. When this circuit 10 is limitation requiring that the value of $R_1$ must be larger than a certain amount. The use of the circuit design 10 of FIG. 1 in this case is undesirable due to the conflicting input impedance and noise issues. For an amplifier-dominated design, very low resistance values for $R_1$ are required, which is not achievable with the prior art circuit 10.

Figure 2:
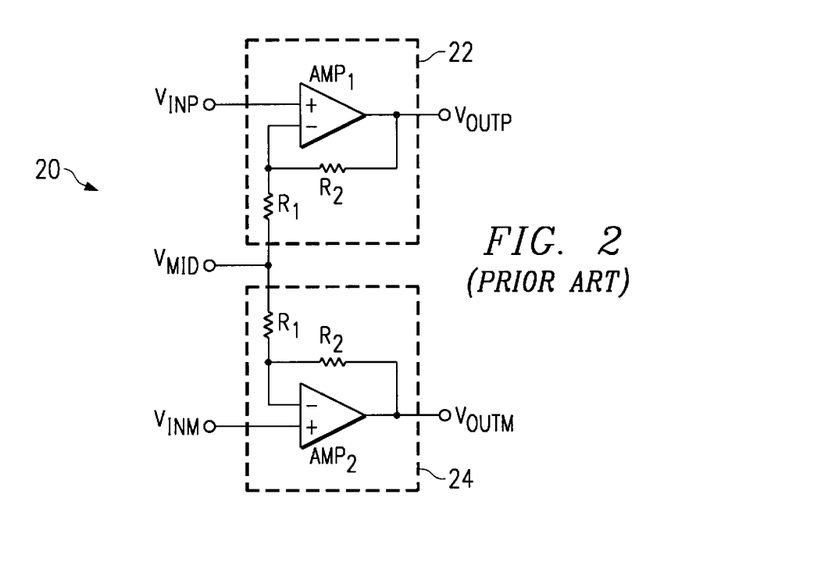
FIG. 2 shows another prior art amplifier circuit that solves the input impedance problem of the circuit in FIG. 1 yet requires additional high power output stages for the amplifiers.

FIG. 2 shows generally at 20 a prior art bridge amplifier circuit that solves the input impedance and noise problem of the circuit 10 but has other problems. The input impedance at $V_{inp}$ and $V_{inm}$ is very high, being input into the gate of a MOSFET of $Amp_1$ and $Amp_2$. The architecture of circuit 20 does not have $R_1$ in series with the input voltage $V_{in}$, thus overcoming the noise vs. input impedance problem of the prior art circuit 10. The closed loop gain $A_{vcl}$ is equal to:

Equation 3:
$$A_{vcl} = \frac{\Delta V_{out}}{\Delta V_{in}} = 2(R_2/R_1 + 1)$$

In the circuit 20, resistor $R_1$ may be a smaller value, because it is not connected directly to the input $V_{in}$. However, resistor $R_1$ still contributes to the noise and, and must be a low value, approximately 100Ω, for example. For a 20 db gain (10×), resistor $R_2$ may be relatively small, approximately 1 KΩ, for example.

While the prior art circuit 20 has relatively low noise, amplifiers $Amp_1$ and $Amp_2$ must be large, complex and current-consuming to achieve high bandwidth. The lower the values of $R_1$ and $R_2$, the more current that must be supplied to them during operation of the circuit 20. The feedback resistors $R_1$ and $R_2$ present a load to amplifiers $Amp_1$ and $Amp_2$ so that an additional second buffering stage is required internal to the amplifiers to drive resistors $R_1$ and $R_2$. The second stages of amplifiers $Amp_1$ and $Amp_2$ are demanding in power consumption, comprising amplifiers such as class AB power output stages, and make it extremely difficult to stabilize the circuit 20 at higher frequencies in a minimal current budget.

Figure 3:
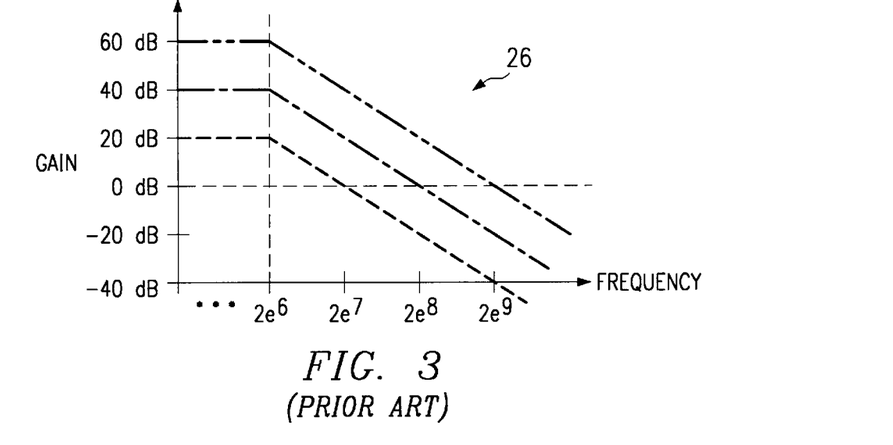
FIG. 3 illustrates the gain and bandwidths available for various frequencies for the circuit of FIGS. 1 and 2.

FIG. 3 illustrates curves of open loop magnitude gain response of a typical amplifier. For a given closed loop gain, to have a 2 MHz bandwidth signal, amplifiers $Amp_1$ and $Amp_2$ require rather large unity gain bandwidths. For example, if 40 db of closed loop gain is required, amplifiers $Amp_1$ and $Amp_2$ would require Unity Gain Frequencies (UGFs) of 200 MHz. In CMOS semiconductor technology, this is very challenging to achieve, even in sub-micron dimensions, at low current, for example, less than 0.5 mA.

The class AB power output stages of amplifiers $Amp_1$ and $Amp_2$ required in the prior art circuit 20 complicate the circuit 20 design. Furthermore, the power overhead needed to attain the aforementioned speeds and the relatively long channel lengths required to meet the noise goals make the 2-stage amplifier design of the circuit 20 in FIG. 2 unfeasible.

The present invention comprises a low current-consuming, low noise, wide bandwidth amplifier circuit architecture that overcomes the aforementioned problems of the prior art. A preferred embodiment of the present invention having two branches 32 and 34 coupled together is generally shown in the circuit 30 of FIG. 4. There is no resistor at the input of operational amplifiers 44 and 46 (the provided signals being $+\Delta V_{in}/2$ and $-\Delta V_{in}/2$), so the circuit 30 has a very high input impedance. The output of amplifiers 44 and 46 are coupled to and adapted to drive the gates of transistors $X_1$ and $X_2$, respectively. Because the gates of transistors $X_1$ and $X_2$ have a very high input impedance, amplifiers 44 and 46 reduce noise in the circuit 30.

Figure 4:
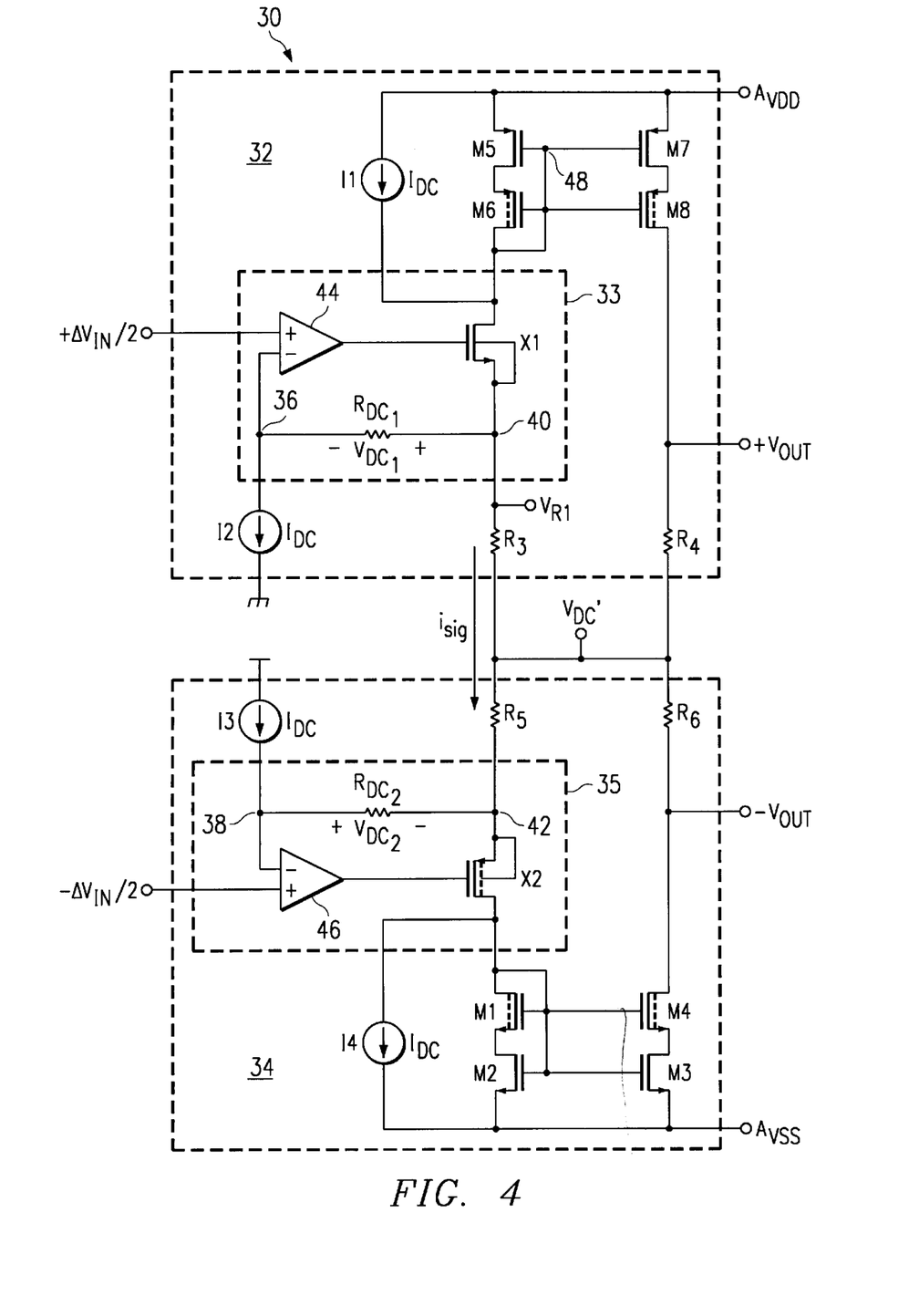
FIG. 4 shows a preferred embodiment of the present invention having a current efficient architecture.

A feedback loop 33 in branch 32 is formed by amplifier 44, NMOS transistor $X_1$, and resistor $R_{DC1}$. Similarly, a feedback loop 35 in branch 34 is formed by amplifier 46, PMOS transistor $X_2$, and resistor $R_{DC2}$. The feedback loops 33 and 35 force node 36 to be $+\Delta V_{in}/2$ and node 38 to be $-\Delta V_{in}/2$, respectively. Referring first to branch 32, the positive (non-inverting) input of amplifier 44 is coupled to a positive input signal $+\Delta V_{in}/2$. The negative (inverting) input of amplifier 44 is coupled at node 36 to a DC current source $I_2$ and to a first end of feedback resistor $R_{DC1}$. The second end of resistor $R_{DC1}$ is coupled at node 40 to the source of transistor $X_1$ and to a first end of resistor $R_3$. Resistor $R_3$ is coupled at a second end to resistors $R_4$, $R_5$ and $R_6$ at a node $V_{DC}$.

which is labeled for discussion purposes rather than connected elsewhere in the circuit. Resistor $R_4$ is coupled at the other end to an output terminal $+V_{out}$.

Referring next to branch 34, the positive (non-inverting) input of amplifier 46 is coupled to a negative input signal $-\Delta V_{in}/2$ that is 180 degrees out of phase with the positive input signal $+\Delta V_{in}/2$. The negative (inverting) input of amplifier 46 is coupled at node 38 to a DC current source $I_3$ and to a first end of feedback resistor $R_{DC2}$. The second end of resistor $R_{DC1}$ is coupled at node 42 to the source of PMOS transistor $X_2$ and to a first end of resistor $R_5$. The second end of resistor $R_5$ is coupled to a first end of resistor $R_6$. Preferably, resistors $R_3$ and $R_5$ are equal and have a relatively low value, e.g. less than 100Ω, to reduce noise on the output signals $+/-V_{out}$ at the second ends of resistors $R_4$ and $R_6$, respectively.

Preferably, amplifier 44 comprises a single-stage cascoded n-channel input amplifier having a low threshold voltage. Amplifier 46 preferably comprises a single-stage, cascoded P-channel input amplifier having a low threshold voltage. Amplifiers 44 and 46 may advantageously be single stage because they do not drive resistors $R_3$ and $R_5$, respectively. Preferably, transistor $X_1$ comprises an NMOS FET and transistor $X_2$ comprises an PMOS FET, as shown.

The feedback loops 33 and 35, in conjunction with resistors $R_3$ and $R_5$, respectively, act as voltage-to-current converters. The current $i_{sig}$ conducting through the node at $V_{DC}$, is a representation of the input at $+/-V_{in}$.

Transistors $M_1$, $M_2$, $M_3$, $M_4$, $M_5$, $M_6$, $M_7$, and $M_8$ form two separate cascoded current mirrors for current matching between the two branches 32 and 34, as shown. Transistors $M_1$, $M_2$, $M_3$ and $M_4$ of branch 34, preferably comprising NMOS MOSFETs, are coupled together and to DC current source $I_4$ to form an open loop current mirror. The gates of transistors $M_1$, $M_2$, $M_3$ and $M_4$ are connected together and are coupled to the drain of transistor $X_2$. The source of transistor $M_1$ is coupled to the drain of transistor $M_2$, and the source of transistor $M_4$ is coupled to the drain of $M_3$. The sources of transistors $M_2$ and $M_3$ are coupled to return voltage $A_{VSS}$. Similarly, transistors $M_5$, $M_6$, $M_7$ and $M_8$ of branch 32 are coupled together and to DC current source $I_1$ to form an open loop current mirror. Preferably, transistors $M_5$, $M_6$, $M_7$ and $M_8$ comprise PMOS MOSFETs. The gates of transistors $M_5$, $M_6$, $M_7$ and $M_8$ are connected together and coupled to the drain of transistor $X_1$. The source of transistor $M_6$ is coupled to the drain of transistor $M_5$, and the source of transistor $M_8$ is coupled to the drain of transistor $M_7$. The sources of transistors $M_5$ and $M_7$ are coupled to supply voltage $A_{VDD}$.

Resistors $R_4$ and $R_6$ are larger than resistors $R_3$ and $R_5$ to achieve a gain. For example, if resistor $R_4$ and $R_6$ are 10 times the values of $R_3$ and $R_5$, the gain of the circuit 30 is 10. The amplifiers 44 and 46 do not drive resistors $R_3$ and $R_5$ as in the prior art, which saves power due to a simpler amplifier design. Amplifiers 44 and 46 are simple, adapted to reduce noise, and have a wider bandwidth than in prior art architectures. Thus, a very controlled gain is achieved while eliminating the noise problems and complicated circuitry of the prior art.

By coupling an input of the amplifier 44 to a current source through resistor $R_{DC1}$, a voltage drop $V_{DC1}$ is formed across $R_{DC1}$. When there is no input signal ($V_{in}=0$), current still flows through transistor $X_1$ and $R_{DC1}$, and the feedback loop 33 continues to function. Similarly, amplifier 46 is coupled to a current source $I_3$ through resistor $R_{DC2}$ resulting in current flow through $R_{DC2}$ when $V_{in}=0$. Node 40 tends to have a higher voltage than node 42 so that current $i_{sig}$ flows from node 40 to node 42 through resistors $R_3$ and $R_5$, due to the configuration of the current sources $I_2$ and $I_3$, and resistors $R_{DC1}$ and $R_{DC2}$. Preferably, the circuit 30 is designed such that the positive peak of the signal at node 42 is less than the negative peak of node 40, to ensure current $i_{sig}$ flows in the direction from node 40 to node 42. A DC offset is created on the voltage output $+/-V_{out}$ because of this condition, which may be removed with a high pass filter.

Figure 5:
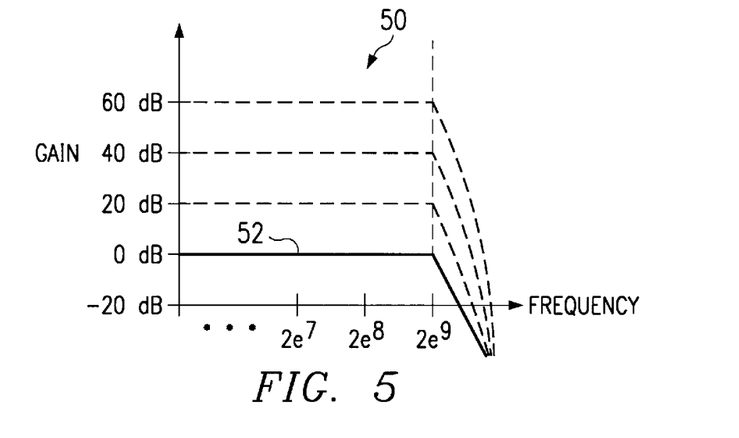
FIG. 5 demonstrates the unity gain and frequency bandwidth achievable with the present invention.
Figure 6:
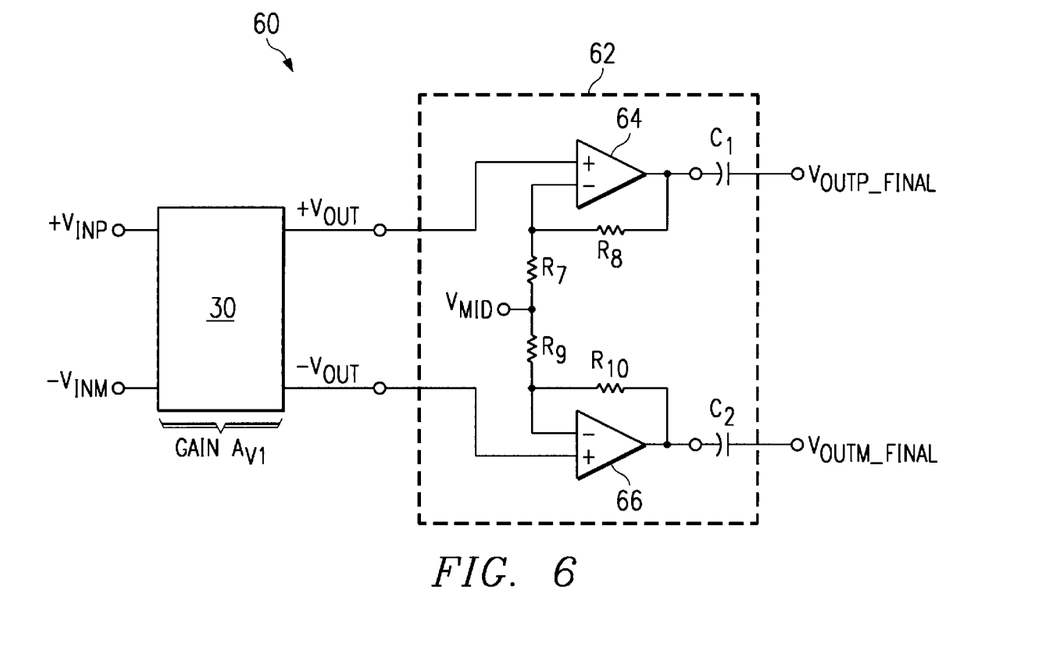
FIG. 6 illustrates the present invention used with an output buffer circuit.

With the novel circuit configuration of the present invention, a very controlled closed loop gain of $R_4/R_3=R_6/R_5$ is attainable without the problems of the prior art. FIG. 5 illustrates how the maximum bandwidth is utilized with the present invention by achieving unity gain. By transforming the input voltage to a current, 0 dB closed loop is attained, achieving maximum bandwidth. The current mirrors $M_1$, $M_2$, $M_3$, $M_4$, $M_5$, $M_6$, $M_7$, and $M_8$ operate in an open loop so the current $i_{sig}$ and resistor ratios $R_4/R_3$ and $R_6/R_5$ determine the gain of the amplifier circuit 30 of the present invention. The gain of the amplifier circuit 30 is completely independent from the amplifiers 44 and 46, rather than being dependent on the bandwidth, as in the prior art.

The following analysis illustrates the functionality of the amplifier circuit 30. In this analysis, $R_3=R_5$, $R_4=R_6$, $R_{DC1}=R_{DC2}$ and $I_2=I_3$. The following equations illustrate the semiconductor wafer real estate dimensional relationships between the transistors of the current mirrors:

$(W/L)_{M5}=(W/L)_{M7}$  Equation 4

$(W/L)_{M6}=(W/L)_{M8}$  Equation 5

$(W/L)_{M1}=(W/L)_{M4}$  Equation 6

$(W/L)_{M2}=(W/L)_{M3}$  Equation 7 where W is the width and L is the length of the MOSFETs comprising transistors $M_1$, $M_2$, $M_3$, $M_4$, $M_5$, $M_6$, $M_7$, and $M_8$. The current through a MOS transistor is proportional to the width/length. If the transistor $M_7$ and transistor $M_5$ are the same size, the current through transistors $M_5$ and $M_7$ is equal. Typically, gain in the circuit 30 is obtained by having a difference in resistors $R_4$, $R_3$, $R_6$ and $R_5$, as previously described. Alternatively, the size of the transistors may be varied, while keeping the resistor values of resistors $R_4$, $R_3$, $R_6$ and $R_5$ equal. For example, transistor $M_7$ may be 10× larger than transistor $M_5$ to obtain gain in the amplifier circuit 30. Therefore, gain in the present invention may be obtained in the current relationship of the current mirrors, or in the resistor relationship, or a combination of both.

Obtaining gain through the current relationship of the transistors of the current mirrors is particularly advantageous in systems or circuit designs requiring gains with multiple dB steps. In an amplifier circuit having many different gain settings, in 1 dB steps, for instance, taps would be required off of resistors $R_4$ and $R_6$ in 1 dB increments to vary the gain. Tapping resistors R4 and R6 in a multiple number of locations is very difficult. Also, dividing in dB increments is non-linear which involves fractional numbers, which is difficult to work with. Rather than having 30 of the non-linear taps off of the resistors, with the present invention, fewer taps, e.g. 6, may be used, in combination with varying the current mirror transistor sizes to obtain a wide range of gain options.

The negative feedback loop 32 formed by amplifier 44 and transistor $X_1$ and the negative feedback loop 34 formed by amplifier 46 and transistor $X_2$ force the input voltages to essentially appear at nodes 36 and 38. Because no current can flow into the amplifier terminals, currents $I_2$ and $I_3$ flow through the resistors $R_{DC1}$ and $R_{DC2}$, respectively, creating the desired voltage drops at nodes 40 and 42:

$$V_{40} = +\Delta V in/2 + I_2 R_{DC1} \quad \text{Equation 8}$$

$$V_{42} = -\Delta V in/2 - I_3 R_{DC2} \quad \text{Equation 9}$$

Preferably, the current mirroring is ideal and no current flows through the connection of branches 32 and 34 at $V_{DC'}$. Voltage $V_{DC'}$ is approximately equal $A_{VDD}/2$. Therefore, the current through resistors $R_3$ and $R_5$, according to Ohms is:

Equation 10:

$$\frac{V_{40} - V_{42}}{2R_3} = i_{sig} = \frac{\Delta V_{IN}}{2R_3} + I_2\left(\frac{R_{DC1}}{R_3}\right)$$

Kirchoff's current law at nodes 40 and 42 shows that $i_{sig}$ flows into both current mirrors formed by transistors $M_1$, $M_2$, $M_3$, $M_4$, $M_5$, $M_6$, $M_7$, and $M_8$. The term $$I_2\left(\frac{R_{DC1}}{R_3}\right)$$

is for DC biasing of the pre-driver stage. Due to the action of the current mirrors, $i_{sig}$ flows in the final output branch, flowing through $R_4$ and $R_6$ with an intermediate DC bias point approximately equal to $A_{VDD}/2$.

Equation 11:

$$\Delta V_{out} = i_{sig}(2R_4) = \left[\frac{\Delta V_{in}}{2R_3} + I_2\left(\frac{R_{DC1}}{R_3}\right)\right]2R_4$$

Equation 12:

$$\Delta V_{out} = \underbrace{\Delta V_{in}\left(\frac{R_4}{R_3}\right)}_{ACSignalPart} + \underbrace{\left(\frac{R_4}{R_3}\right)I_2 R_{DC1}}_{DCBiasPart}$$

Equation 12 shows the gain is dependent upon $$\frac{R_4}{R_3},$$

a well-matched resistor ratio. Note that elsewhere in the circuit, a high pass function is needed to remove the DC component of Equation 12.

In the present invention, there is tight control of bias points and bias currents, and the gain is process and temperature independent (to $1^{st}$ order). Amplifiers 44 and 46 of circuit 30 drive purely capacitive loads. Resistors $R_3$, $R_4$, $R_5$ and $R_6$ may be very small values for low noise without complicating the amplifier design or negatively impacting the input impedance of the amplifier circuit 30. Amplifiers 44 and 46 need a very high bandwidth in order to maintain the gain out to 2 MHz, which is much more easily achievable than in the prior art circuits 10 and 20 of FIGS. 1 and 2.

Other design considerations include that preferably $R_{DC1}I_2$ and $R_{DC2}I^3$ are greater than $\Delta V_{in}$. Furthermore, $R_{DC1}I_2$ and $R_{DC2}I^3$ are preferably less than the allotted supply range. For example, if $R_{DC1}I_2$=100 mV of added bias and 40 dB is the chosen closed loop gain, then 100 mV×(40 dB)=10V. Current mirror speeds must also be very high, but since these are run essentially "open-loop" these will not affect the stability of the system. Closed loop gain is now decoupled from the amplifier open loop gain. For example, amplifiers 44 and 46 with UGF's of 70 MHz yield a closed loop gain of 40 dB with the present invention.

For practical purposes, because the currents between the two branches are matched, there cannot be any dynamic current loss to any other path and a high pass filter may not be implemented directly. A practical implementation of the present invention is shown generally at 60 in FIG. 5. A buffering stage 62 is coupled to the amplifier circuit 30 having a high pass function to remove the DC component of the output signal $V_{out}$ generated by the circuit 30 of FIG. 4. The buffering stage 62 comprises two amplifiers 64 and 66 coupled to resistors $R_7$, $R_8$, $R_9$, and $R_{10}$, as shown. Preferably, $R_7 = R_8$ and $R_9 = R_{10}$. The buffering stage 62 includes capacitors $C_1$ and $C_2$ that provide the high pass function, while the $R_8/R_7$ ratio provides additional gain.

The total input referred noise is dominated by the amplifier circuit 30 and resistors $R_3$, $R_4$, $R_{DC1}$, and $R_{DC2}$ provided that $R_3$ and $R_4$ have low values. The half-circuit results at node 48 of FIG. 4 are:

Equation 13:

$$\overline{V_{48}^2} = \overline{V_{44}^2} + \overline{V_{rdc1}^2} + \overline{V_{r3}^2} + \frac{\overline{V_{x1}^2}}{(A_{44})^2} + \underbrace{\left(\frac{g_{m x5}}{g_3}\right)^2 \overline{V_{x5}^2}}_{B} + \underbrace{\left(\frac{g_m I_2}{g_3}\right)^2 \overline{V_{I2}^2} + \left(\frac{g_m I1}{g_3}\right)^2 \overline{V_{I1}^2}}_{C}$$

Where $\overline{V_{48}^2}$ is the input referred noise total with respect to the output node 48, B is noise from the transistor of current source $I_2$, C is noise from the transistor of current source $I_1$. $A_{44}$ is the gain of the amplifier 44, $g_m$ terms are the small signal transconductances of the MOSFETs M5 and transistors that act as current sources $I_1$ and $I_2$, and $g_3$ is equal to 1/R3. The gain of $V_{44}$ is assumed in equation 13 to be 10 or greater.

The half-circuit, single ended total input referred noise $V_I$ noise total with respect to $V_{out}$ is:

Equation 14:

$$\overline{V_{44}^2} + \overline{V_{R3}^2} + \overline{V rdc1^2} + \frac{\overline{Vx1^2}}{(A)^2} + \left(\frac{g_m 5}{g_3}\right)^2 \overline{Vm5^2} + \left(\frac{-2g_m I2}{g_3}\right)^2 \overline{Vm I2^2} + \left(\frac{g_m I1}{g_3}\right)^2 \overline{VmI1^2} + \frac{\overline{Vm7^2}}{(-g_3/g_{m5})^2} + \frac{\overline{VR4^2}}{[(-g_3/g_{m5})(-g_{m7}/g_4)]^2}$$

The first three terms are typically the main contributors in the equation. For example, if $R_3$=50Ω, 1/50Ω=20 mS, which is much larger than the $g_m$ terms in equation 14. Also, note that the last term in equation 14 is due to gain-setting resistor $R_4$, where:

$$\overline{V_{R4}^2} = 4kTR_4\Delta f \quad \text{Equation 15}$$

where k is Boltzman's constant, T is the temperature in Kelvin, and $\Delta f$ is the frequency range of bandwidth. If the gain is all in resistor value, (rather than partially from the current mirrors) then $g_{m5} = g_{m7}$, and:

Equation 16:

$$\frac{\overline{V_{R4}^2}}{(g_3/g_4)^2} = \frac{\overline{V_{R4}^2}}{(A_{vc1})^2}$$

If the gain is 10, then:

$$\overline{V_{R_4}^2} = \frac{4kT\,10R_3\Delta f}{(10)^2};$$

$$\overline{V_{R_4}^2} = \frac{4kTR_3\Delta f}{10}; \text{ and}$$

Equation 17:

$$\overline{V_{R_3}^2} \Big) \frac{\overline{V_{R_4}^2}}{(A_{vcl})}$$

by a factor of 10 or $A_v$ closed loop.

Therefore the resistance is less of a problem with a high gain setup in the present invention, as compared with the prior art.

In conclusion, the present circuit 30 results in a wideband operational transconductance amplifier design (OTA) with ultra low noise that drive only a capacitive load. By selecting the correct gain and DC bias point, $R_{DC1}$, $R_{DC2}$, $R_3$ and $R_5$ may be very small. This yields a much lower current-consuming amplifier circuit design than in the prior art, given the same performance goals.

The present invention provides a low power way of achieving a closed loop voltage gain with a ultra low noise floor. Advantages of the invention are the ability to use small resistors for $R_3$ and $R_5$. The need for an output stage has been removed, so that simple single stage op amps may be used for amplifiers 44 and 46. This results in high closed loop gain, translating to wide bandwidth. Also, the circuit 30 is low in noise and consumes less current than prior art circuits. The amplifiers 44 and 46 have a very high input impedance. Furthermore, the circuit has great flicker and thermal noise performance. The gain and bandwidth are independent of one another, rather than being a function of one another as in prior art circuits. The present invention also maximizes total harmonic distortion (THD) and power supply rejection ratio (PSRR). Gain is achieved by the resistor ratio, through the transistors of the current mirror circuits, or a combination thereof.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the amplifier circuit 30 of the present invention may be utilized in a wide variety of applications, such as telecommunications applications, mobile devices and systems, laptops and personal computers, mixed signal and analog devices, and any lower power electrical application, in general. The low noise amplifier design is particularly useful in an intermediate frequency front-end circuit of a wireless telecommunications device or system, for example.

What is claimed is:

1. A low noise, low current, high bandwidth amplifier circuit, comprising:

a first amplifier driving a first transistor;

a first current source coupled to an input of said first amplifier;

a first resistor coupled between said first current source and said first transistor;

a second resistor coupled to said first resistor;

a second amplifier driving a second transistor;

a second current source coupled to an input of said second amplifier;

a third resistor coupled between said second current source and said second transistor; and a fourth resistor coupled to said third resistor, wherein said first and third resistors are driven by said first and second current sources, respectively, rather than by said first and second amplifiers, respectively, and wherein said first amplifier, said first transistor and said first resistor provide a first feedback loop and further wherein said second amplifier, said second transistor and said third resistor provide a second feedback loop that is independent of said first feedback loop.

2. The amplifier circuit of claim 1 wherein said first amplifier drives a gate of said first transistor, said second amplifier drives a gate of said second transistor, said first resistor is coupled to a source of said first transistor, and said third resistor is coupled to a source of said second transistor.

3. The amplifier circuit of claim 2 wherein said first and second amplifiers comprise a single stage amplifier.

4. The amplifier circuit of claim 2 wherein said third resistor has the same value as said first resistor, said fourth resistor has the same value as said second resistor, wherein the gain of said amplifier circuit is a function of the ratio between said second resistor and said first resistor.

5. The amplifier circuit of claim 1 further comprising:

a first current mirror circuit providing current to a drain of said first transistor;

a second current mirror circuit providing current to a drain of said second transistor;

a fifth resistor coupled between said first current mirror circuit and said second resistor, and a sixth resistor coupled between said second current mirror circuit and said fourth resistor, and wherein the second, fourth, fifth and sixth resistors are coupled to a common DC voltage.

6. The amplifier circuit of claim 1 further comprising:

a first current mirror circuit conducting a first current and coupled to said first transistor; and a second current mirror circuit conducting a second current and coupled to said second transistor.

7. The amplifier circuit of claim 6 wherein said first current mirror circuit comprises a plurality of third transistors coupled to a voltage source, said gates of said third transistors being coupled together, wherein said second current mirror circuit comprises a plurality of fourth transistors coupled to a voltage return, said gates of said fourth transistors being coupled together.

8. The amplifier circuit of claim 6 wherein the gain of the amplifier circuit is a function of the first current mirror circuit first current.

9. A low noise, low current, high bandwidth amplifier circuit, comprising:

a first amplifier driving a gate of a first transistor;

a first current mirror circuit providing current to a drain of said first transistor;

a first current source coupled to an input of said first amplifier;

a first resistor coupled between said first current source and the source of said first transistor;

a second resistor coupled to said first resistor;

a second amplifier driving a gate of a second transistor;

a second current mirror circuit providing current to a drain of said second transistor;

a second current source coupled to an input of said second amplifier;

a third resistor coupled between said second current source and the source of said second transistor; and a fourth resistor coupled to said third resistor, wherein said first and third resistors are driven by said first and second current sources, respectively, rather than by said first and second amplifiers, respectively, wherein said first and second amplifiers comprise a single stage.

10. The circuit of claim 9 wherein the gain of the amplifier is a function of the current conducting through the mirror circuits.

11. The circuit of claim 9 wherein said third resistor has the same value as said first resistor, said fourth resistor has the same value as said second resistor, wherein the gain of said amplifier circuit is a function of the ratio between said second resistor and said first resistor.

12. The circuit of claim 9 further comprising:
a fifth resistor coupled between said first current mirror circuit and said second resistor, and
a sixth resistor coupled between said second current mirror circuit and said fourth resistor, and wherein the second, fourth, fifth and sixth resistors are coupled to a common DC voltage.

13. The circuit of claim 9 wherein said first current mirror circuit comprises a plurality of third transistors coupled to a voltage source, each said third transistor having a gate coupled to the other, wherein said second current mirror circuit comprises a plurality of fourth transistors coupled to a voltage return, each said fourth transistor having a gate coupled to the other.

14. The circuit of claim 9 further comprising a buffering stage coupled to said third and fourth resistors, said buffering stage having a high pass filter.

15. An amplifier circuit having a first branch coupled to a second branch, said first branch comprising;
a first amplifier having a first and second input terminal and driving a first transistor, said first input terminal adapted to receive a positive input voltage signal;
a first resistor coupled between said first transistor and said first input terminal;
a first current source providing a first current to said first amplifier second input terminal;
a second resistor coupled at one end to said first resistor with a positive output voltage being generated at said second resistor other end;
wherein said second branch comprises:
a second amplifier having a first and second input terminal and driving a second transistor, said second amplifier first input terminal adapted to receive a negative input voltage signal;
a third resistor coupled between said second transistor and said second amplifier first input terminal;
a second current source providing a second current to said second amplifier second input terminal; and
a fourth resistor having a first and second end, said fourth resistor first end coupled to said third resistor with a negative output voltage being generated at said fourth resistor second end, said fourth resistor being coupled to said second resistor, wherein said first and third resistors are driven by said first and second current sources, respectively, rather than by said first and second amplifiers, respectively.

16. The circuit of claim 15 further comprising:
said first and second transistor each comprising a FET having a gate, source and drain;
a fifth resistor coupled between said first current source and said first resistor; and
a sixth resistor coupled between said second current source and said third resistor, wherein said first amplifier drives the gate of said first transistor, said second amplifier drives the gate of said second transistor, said first resistor is coupled to the source of said first transistor, and said third resistor is coupled to the source of said second transistor.

17. The circuit of claim 16 further comprising:
a first current mirror circuit providing a first current to the drain of said first transistor and said second resistor; and
a second current mirror circuit providing a second current to the drain of said second transistor and said fourth resistor.

18. The circuit of claim 17 wherein said first current mirror circuit comprises a plurality of third transistors coupled to a voltage source, each said third transistor having a gate being coupled together with the gates of the other said third transistors, and wherein said second current mirror circuit comprises a plurality of fourth transistors coupled to a voltage return, each said fourth transistor having a gate being coupled together with the gates of the other said fourth transistors.

19. The circuit of claim 18, wherein the gain of the amplifier circuit is a function of the first current conducting through the first current mirror circuit.

20. In an amplifier circuit having a first and second branch, each said branch comprising an amplifier driving a respective transistor, a first resistor coupled between an input of said respective amplifier and said transistor, a second resistor coupled to said respective transistor, said branches being coupled together at said second resistors, a method of amplifying an electric input signal comprising the steps of:
driving said first resistors with a respective first current source;
providing a second current from a current mirror through said respective second resistor; and
generating an output signal at said second resistors.

21. The method of claim 20 further comprising the step of: conducting said second current through said respective transistor.

22. The method of claim 21, wherein the gain of said amplifier circuit is a function of the second current.

23. The method of claim 20 wherein no current is conducted between said first and second branches.

24. The method of claim 20 wherein the gain of said amplifier circuit is a function of the ratio of said second resistor and said first resistor.

25. The method of claim 21 further comprising the step of buffering the output signal from each said amplifier with a high pass filter.

26. A low noise, low current, high bandwidth amplifier circuit, comprising:
a first amplifier driving a first transistor;
a first current mirror circuit conducting a first current and coupled to said first transistor;
a second current mirror circuit conducting a second current and coupled to said second transistor;
a first current source coupled to an input of said first amplifier;
a first resistor coupled between said first current source and said first transistor;
a second resistor coupled to said first resistor;
a second amplifier driving a second transistor;
a second current source coupled to an input of said second amplifier;

a third resistor coupled between said second current source and said second transistor; and a fourth resistor coupled to said third resistor, wherein said first and third resistors are driven by said first and second current sources, respectively, rather than by said first and second amplifiers, respectively.

27. The amplifier circuit of claim 26 wherein said first amplifier drives a gate of said first transistor, said second amplifier drives a gate of said second transistor, said first resistor is coupled to a source of said first transistor, and said third resistor is coupled to a source of said second transistor.

28. The amplifier circuit of claim 27 wherein said first and second amplifiers comprise a single stage amplifier.

29. The amplifier circuit of claim 27 wherein said third resistor has the same value as said first resistor, said fourth resistor has the same value as said second resistor, wherein the gain of said amplifier circuit is a function of the ratio between said second resistor and said first resistor.

30. The amplifier circuit of claim 26 wherein said first current mirror circuit comprises a plurality of third transistors coupled to a voltage source, said gates of said third transistors being coupled together, wherein said second current mirror circuit comprises a plurality of fourth transistors coupled to a voltage return, said gates of said fourth transistors being coupled together.

31. The amplifier circuit of claim 26 wherein the gain of the amplifier circuit is a function of the first current mirror circuit first current.

32. A low noise, low current, high bandwidth amplifier circuit, comprising:

a first amplifier driving a first transistor;

a first current source coupled to an input of said first amplifier;

a first resistor coupled between said first current source and said first transistor;

a second resistor coupled to said first resistor;

a second amplifier driving a second transistor;

a second current source coupled to an input of said second amplifier;

a third resistor coupled between said second current source and said second transistor; and a fourth resistor coupled to said third resistor, wherein said first and third resistors are driven by said first and second current sources, respectively, rather than by said first and second amplifiers, respectively, and further wherein said first amplifier drives a gate of said first transistor, said second amplifier drives a gate of said second transistor, said first resistor is coupled to a source of said first transistor, and said third resistor is coupled to a source of said second transistor.

33. The amplifier circuit of claim 32 wherein said first and second amplifiers comprise a single stage amplifier.

34. The amplifier circuit of claim 32 wherein said third resistor has the same value as said first resistor, said fourth resistor has the same value as said second resistor, wherein the gain of said amplifier circuit is a function of the ratio between said second resistor and said first resistor.

35. The amplifier circuit of claim 32 further comprising:

a first current mirror circuit providing current to a drain of said first transistor;

a second current mirror circuit providing current to a drain of said second transistor;

a fifth resistor coupled between said first current mirror circuit and said second resistor, and a sixth resistor coupled between said second current mirror circuit and said fourth resistor, and wherein the second, fourth, fifth and sixth resistors are coupled to a common DC voltage.

36. The amplifier circuit of claim 32 wherein said first current mirror circuit comprises a plurality of third transistors coupled to a voltage source, said gates of said third transistors being coupled together, wherein said second current mirror circuit comprises a plurality of fourth transistors coupled to a voltage return, said gates of said fourth transistors being coupled together.

37. The amplifier circuit of claim 32 wherein the gain of the amplifier circuit is a function of the first current mirror circuit current.

* * * * *